United States Patent [19]

Gardner

[11] Patent Number: 4,603,927

[45] Date of Patent: Aug. 5, 1986

[54] SURFACE MOUNTED BUSSING DEVICE

[75] Inventor: John R. Gardner, Mesa, Ariz.

[73] Assignee: Rogers Corporation, Rogers, Conn.

[21] Appl. No.: 630,027

[22] Filed: Jul. 12, 1984

[51] Int. Cl.⁴ .................. H01R 9/09; H01R 31/08
[52] U.S. Cl. ................................ 339/17 C; 339/19; 361/407
[58] Field of Search ............. 339/17 R, 17 C, 17 CF, 339/17 M, 17 N, 18 R, 18 B, 18 C, 19, 222, 242, 14 R; 361/386, 388, 403–407; 174/72 B, 52 FP

[56] References Cited

U.S. PATENT DOCUMENTS

| | | | |
|---|---|---|---|
| 3,218,606 | 11/1965 | Schultz | 339/17 M |
| 3,396,230 | 8/1968 | Crimmins | 174/72 B |
| 3,491,267 | 1/1970 | Goshorn | 361/407 |
| 3,643,133 | 2/1972 | Towell | 361/407 |
| 3,668,606 | 6/1972 | Walter | 174/72 B |
| 3,688,635 | 9/1972 | Fegen | 339/17 R |
| 3,708,610 | 1/1973 | Kozel et al. | 174/72 B |
| 3,808,588 | 4/1974 | McGregor | 339/17 R |
| 3,842,492 | 10/1974 | Kamerbeek et al. | 357/70 |
| 3,912,984 | 10/1975 | Lockhart, Jr. et al. | 339/17 CF |
| 3,941,443 | 3/1976 | Reimer | 339/22 B |
| 4,004,195 | 1/1977 | Harayda et al. | 361/388 |
| 4,194,801 | 3/1980 | Fitzler et al. | 339/19 |
| 4,208,080 | 6/1980 | Teagno | 339/18 B |
| 4,488,202 | 12/1984 | Kaufman | 361/412 |

FOREIGN PATENT DOCUMENTS 1374666  11/1974  United Kingdom ............... 361/407

OTHER PUBLICATIONS

IBM Bulletin, Roche et al., vol. 6, No. 8, p. 87, 1-1964.
IBM Bulletin, Adams et al., vol. 22, No. 2, p. 527, 7-1979.
DIP Buss, Rogers Corp., Rogers, Conn., 5-1975.

Primary Examiner—Neil Abrams
Attorney, Agent, or Firm—Fishman & Dionne

[57] ABSTRACT

A surface mounted buss bar system is presented wherein the buss bar is mounted on the surface of a circuit board by mounting pads at fixed locations on the board. The buss bar may be mounted directly to the pads or on studs connected to the pads. No through holes or other mounting holes are required in the board for the buss bar.

10 Claims, 10 Drawing Figures

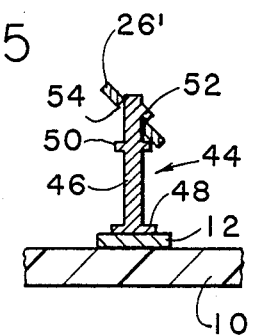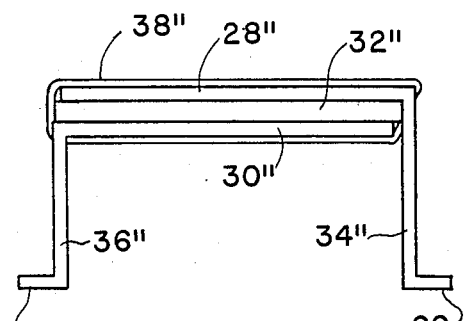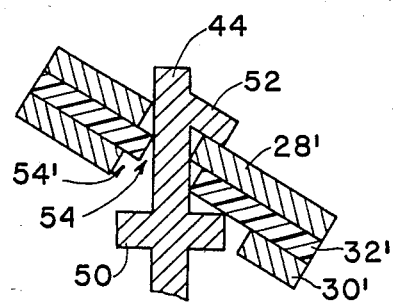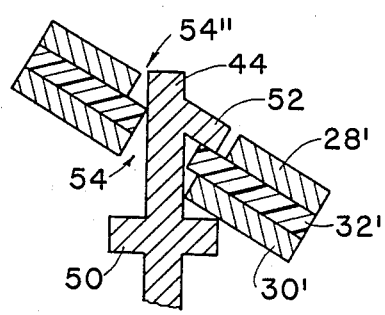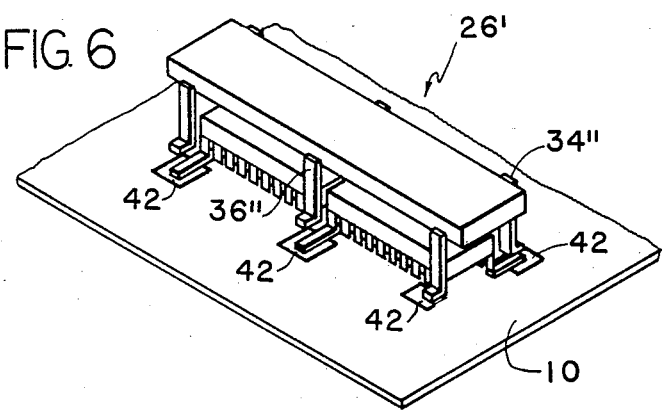

SURFACE MOUNTED BUSSING DEVICE

BACKGROUND OF THE INVENTION

This invention relates to buss bar systems. More particularly, this invention relates to surface mounted buss bars, i.e., buss bars mounted on the surface of printed circuit boards.

Several prior art systems exist for supplying power and/or signals to circuit board components. However, these prior art systems all have various disadvantages or drawbacks.

One prior art system uses buss bars mounted in plated through holes in the circuit board. This system has the disadvantage of requiring plated through holes in the board, which are both expensive and have alignment problems.

Another prior art system uses conductive traces on the circuit board to supply power and/or signals to components. This system is characterized by high inductance and high losses (because of long and unopposed surface traces); uses up a lot of the surface area of the board, and prevents interconnection between components on opposite sides of a conductive trace (unless conductive masking is used to bridge the trace). To illustrate the large amount of surface area taken up by a system of this type, a pair of traces (power and ground) and the spacing between them will require a span of from 90 to 250 mills and will run along most of the length or width of the board. This greatly reduces the amount of surface area (sometimes referred to in the art as "real estate" available for component mounting on the board, especially if two or more pairs of traces are used.

Still another prior art system is the four layer board system. In this system, two boards are employed, with each board having circuit components and traces on one side. On one board, the other side is a power layer, while the other side of the other board is a ground layer. The boards are mechanically joined by a nonconductive adhesive bonding the ground and power layers together (which electrically isolates them). While these four layer board systems have low inductance and low loss (because of the opposite directions of current flow in the power and ground layers) they have other drawbacks. They require the use of a large amounts of material, and, hence, are expensive. Also, they require the use of through holes to connect components to power and ground; and hence they have alignment problems. They are relatively complex systems, and the complexities lead to reliability problems.

Several of the prior art systems require external capacitors for noise supression.

SUMMARY OF THE INVENTION

The above discussed and other problems of the prior art are overcome or alleviated by the surface mounted buss bar system of the present invention.

In accordance with the present invention, a buss bar is mounted on the surface of a printed circuit board. Preferably, the buss bar has at least two electrically conducting layers, one power and one ground, separated by an insulator. In an alternative construction, useful primarily for shielding or signal transmission, the buss bar may have a single conducting layer. The buss bar is electrically and mechanically connected to the circuit board by connection pads (preferably solder pads) on the board. The body of the buss bar is oriented perpendicular to the surface of the circuit board, and pins projecting from the buss bar are mechanically and electrically connected to the pads. Components on the board and/or conductive traces are connected to the pins on the buss bar via the pads.

In an alternative configuration, studs are mounted to the connection pads on the surface of the circuit board, and the buss bar is mounted on the studs. In another alternative configuration, the body of the buss bar is parallel to the surface of the circuit board and is mounted over integrated circuits; and in this configuration the buss bar may also act as a heat sink for the integrated circuits.

The surface mounted buss bar system of the preferred two conductor construction of the present invention solves or alleviates many of the problems of the prior art and has many advantages. The high inductance and high losses of the prior art are eliminated or reduced; and the need for external capacitors is reduced. Both of these results are realized because the buss bar is a pair of conductive plates (ground and power) separated by insulation, with opposite current flows and high internal capacitance. The surface mounted buss bar system eliminates the need for through holes and their attendant alignment problems. Also, the present invention results in the conservation of significant amounts of board space (i.e., "real estate") acts as an R.F. shield, and permits direct access and connection between components on opposite sides of the buss bar, since the buss bar does not block the path between those components as is the case with traces used for power distribution. While the single conductive layer configuration does not realize the advantages of reduction of inductance and loss problem or eliminate the need for capacitors, it does achieve the other advantages (alignment, conservation of real estate and direct access) and also serves as an R.F. shield and as a grounding device.

The above mentioned and other advantages will be apparent to and understood by those skilled in the art from the following detailed description and drawings and will be discussed in more detail hereinafter.

BRIEF DESCRIPTION OF THE DRAWINGS

Referring now to the drawings, wherein like elements are numbered alike in the several FIGURES:

FIG. 5 is a sectional view along line 5—5 of FIG. 4.

FIGS. 5A and 5B show details of FIG. 5.

FIG. 6 is a side elevation view of another modified version of a surface mounted bussing system in accordance with the present invention.

FIG. 7 is a sectional elevation view along line 7—7 of FIG. 6.

DESCRIPTION OF THE PREFERRED EMBODIMENTS

Figure 1:
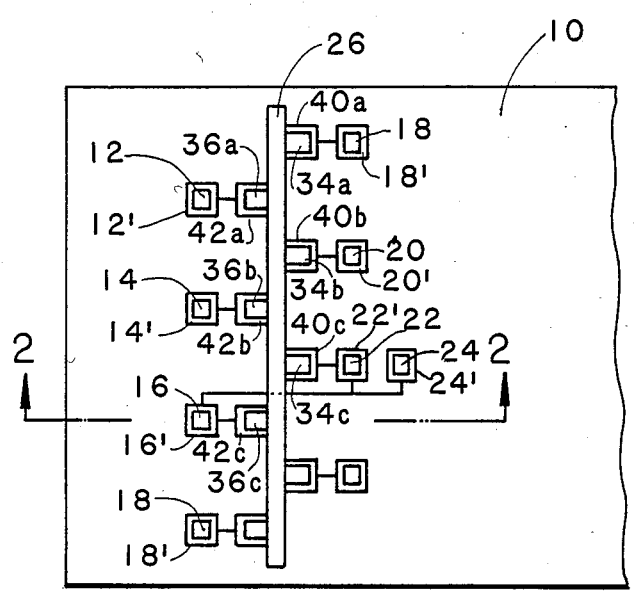
FIG. 1 is a top plan view of a surface mounted bussing system in accordance with the present invention.

Referring first to FIGS. 1 and 2, a basic arrangement of the surface mounted bussing system of the present invention is shown.

A circuit board 10 of insulating material (only a part of which is shown) has a plurality of surface mounted circuit components 12-24 mounted thereon. These circuit components may be surface mounted integrated circuits (SOIC), resistors, inductors, etc. The circuit components 12-24 are physically attached to board 10 by solder pads 12'-24', and those solder pads also serve as part of power and/or signal supply or interconnect systems for the circuit components. It will, of course, be understood that the circuit components shown in FIG. 1 are only for purposes of illustration and do not depict any specific circuit configuration.

The surface mounting of circuit components such as 12-24 on solder pads 12-22 is known in the art. In accordance with known principles, board 10 is formed with the solder pads thereon and a desired pattern of circuit traces (formed by conventional printed circuit techniques) interconnecting various of the solder pads. The circuit components 12-24 are vacuum positioned on the respective pads, and the solder pads are taken through a vapor phase to reflow the solder and mechanically bond the circuit components to circuit boards. Numerous advantages are realized by surface mounting components rather than mounting components in through holes. Among these advantages are: denser packaging of components on the board; high density component mounting on both sides of the board; smaller components can be used (because heavy lead wires for the through hole connection are not needed; components can be mass loaded; and significant savings can be realized because the cost of surface mounting is considerably less than that of auto insertion.

Heretofore, power supply to surface mounted circuit components has been effected either by buss bars mounted in through holes, by multilayer boards, or by conductive printed circuit traces on the circuit board. The former two approaches perpetuates most of the disadvantages associated with through hole mounting. The latter approach introduces several other major problems. Among the problems encountered with the use of circuit traces for power supply are: high inductance and high levels of noise (problems which become especially severe in high frequency systems); low capacitance, requiring the use of external capacitors; high resistivity (R), high characteristic impedance (Z), and high losses.

Figure 2A:
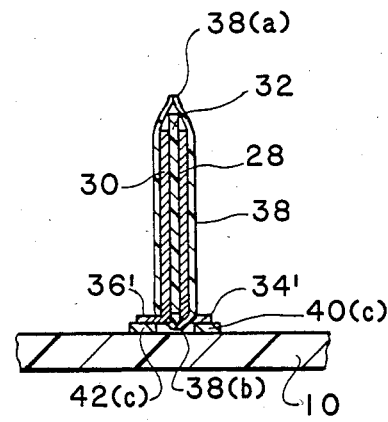
FIG. 2A is a sectional elevation view along line 2—2 of FIG. 1.
Figure 2B:
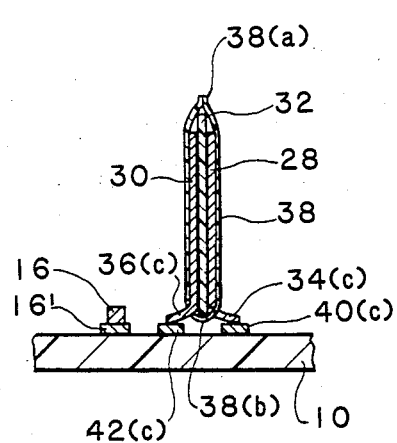
FIG. 2B is a sectional elevation view similar to FIG. 2A showing a modification.

Referring jointly to FIGS. 1, 2A and 2B, the surface mounted buss bar system of the present invention is shown. As seen in FIGS. 2A and 2B, the buss bar 26 has a pair of elongated rectangular metal conductor plates 28 and 30 separated by an insulating spacer 32. A plurality of distribution tabs 34a, 34b, 34c, etc. and 36a, 36b, 36c, etc. extend from plates 28 and 30, respectively, and are bent at approximately 90° to be perpendicular to conductors 28 and 30 and parallel to the circuit board 10. Tabs 34 and 36 are spaced or offset relative to each other in any desired pattern depending on requirements for use. Plates 28 and 30 are adhesively bonded to insulator 32, and the assembly is encapsulated in an outer insulating sheath 38. It is important to note that in FIG. 2B, insulating sheath 38 has overlapping portions 38a at the top, but is wrapped tightly around the bottom of the assembly at 38b where the tabs penetrate the insulating sheath. This bottom wrap permits the buss bar to be mounted immediately above the surface of board 10. However, in FIG. 2A, insulating sheath 38 has overlapping portions at both the top (38a) and the bottom (38b). It will be appreciated that the sheath construction of FIG. 2B is preferable.

It should be understood that while FIGS. 1, 2A and 2B show a preferable two layer construction, i.e., two conductor plates 28 and 38, in an alternative construction, the buss bar of the present invention may have a single conductive layer. This alternative single conductive construction would be primarily useful for shielding or signal transmission.

Buss bar 26 is mechanically and electrically connected to board 10 by the tabs 34a, 34b, etc. and 36a, 36b, etc. which are connected and fused to solder pads 40a, 40b, 40c, etc. and 42a, 42b, 42c, etc., respectively. As with the technique for surface mounting other components, buss bar 26 is vacuum positioned with the tabs 34 and 36 on the appropriate solder pads, and the solder pads are taken through a vapor phase to reflow the solder to mechanically mount the buss bar on board 10 and electrically connect the buss bar to circuits and components connected to the respective solder pads. Thus, as illustrated in FIG. 1, tab 34a is mechanically and electrically connected to pad 40a and is connected by a circuit trace to pad 18' and circuit component 18', tab 36a is connected to pad 40a and is connected by a circuit trace to pad 12' and circuit component 12; etc.

Most important to note is that circuit components on opposite sides of buss bar 26 can be directly connected together by a simple direct circuit trace between them which passes under buss bar 26. Thus, tab 36c is connected to pad 42c and is connected via circuit traces to pad 16' and component 16 on the left side of buss bar 26 and thence to pads 22' and 24' and to circuit components 22 and 24 on the right side of buss bar 26. This simple direct connection between components on opposite sides of bussing structure via circuit traces passing under the buss bar is not possible when circuit traces are used as the bussing structure.

Figure 3:
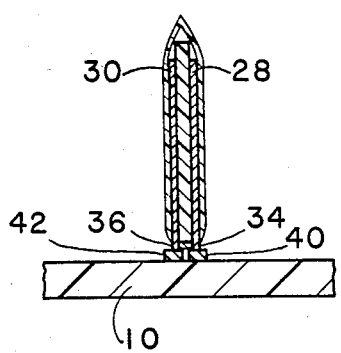
FIG. 3 is a view similar to FIGS. 2A and 2B showing a modification.

Referring to FIG. 3, a modified version of the buss bar is shown where the tabs 34 and 36 project straight from conductors 28 and 30 without being bent. This modification permits the pads 40 and 42 to be mounted closer together and buss bar to be mounted in a narrower space (i.e., take up less real estate) than the FIG. 2 embodiment.

Figure 4:
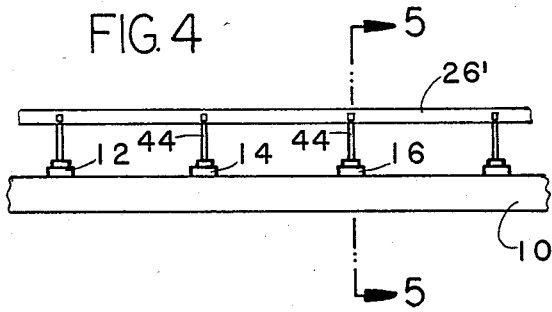
FIG. 4 is a side elevation view of another modified version of a surface mounted bussing system in accordance with the present invention.

Referring to FIGS. 4 and 5, another embodiment of the present invention is shown wherein a buss bar 26' is mounted on electrically conductive metal studs 44 rather than being mounted directly on the circuit board. As best seen in FIG. 5, each stud 44 has a stem portion 46 and an enlarged base segment 48. The base segment 48 is mechanically and electrically connected to a solder pad (e.g., a pad 12) on circuit board 10. The upper part of stud 44 has a horizontal cross piece 50 and a downwardly angled lip or latch segment 52 (which may flex to permit mounting of the buss bar). Buss bar 26' may be either a single conductive layer (i.e., ground or power), or it may be a two layer (ground and power) unit separated by an insulating spacer as in FIG. 2. In either event, buss bar 26' has a series of mounting holes 54 formed therein, whereby buss bar 26' may be snap mounted into place on the studs 44 at the locations of the several holes 54.

As shown in FIGS. 5A and 5B, the mounting holes 54 through the buss bar must be specifically configured if a two layer buss bar is used. Thus, in FIG. 5A, hole 54 is enlarged at 54' in conductive plate 30' so that the buss bar is held on stud 44 between cross piece 50 in contact with insulator 32' and lip 52 in contact with conductor 28'. The enlarged opening 54' prevents contact between the stud and conductor 30. Thus, in the arrangement of FIG. 5A, the stud will be connected only to conductor 28', which, for purposes of discussion, will be the power conductor. Conversely, in the arrangement shown in FIG. 5B, hole 54 is enlarged at 54" in conductor 28', so that the buss bar is held on stud 44 between cross piece 50 in contact with conductor 30' and lip 52 in contact with insulator 32'. The enlarged opening 54" prevents contact between the stud and conductor 28'. Thus, in the arrangement of FIG. 5B, the stud will be connected only to conductor 30', which, for purposes of discussion, is the ground conductor.

The studs of FIGS. 4 and 5 can also be used to surface mount individual circuit components to a circuit board. Thus odd size or odd components can easily be mounted on and electrically connected to a board by such studs connected to solder pads.

Referring to FIGS. 6 and 7, the buss bar 26" is shown mounted over an array of surface mounted integrated circuits (SOIC) 56 on circuit board 10. In this configuration, buss bar 26" is parallel to the SOIC's and the circuit board, but it takes up no extra real estate, because it is mounted over the SOIC's. Buss bar 26" has conductors 28" and 30" separated by insulating spacer 32", and an outer insulating sheath 38". Contact tabs 34" and 36" extend from conductors 28" and 30", respectively, perpendicular to the conductors and the circuit board 10. These contact tabs have foot portions 58 and 60 which are parallel to circuit board 10, and feet 58 and 60 are mechanically and electrically connected to the same solder pads to which the power and ground pins of the SOIC's are connected (or to such other solder pads as may be desired).

In addition to not taking up any extra real estate, the buss bar 26" may also serve as a heat sink for the SOIC's.

The surface mounted buss bars of the present invention have several advantages over the prior art, as discussed above. In addition, such buss bars when compared to circuit traces used for bussing have higher capacitance, lower inductance, lower circuit noise, require less external capacitance, and have lower resistivity and characteristic impedance.

In one specific example, the following comparison can be made between (1) a surface mounted buss bar of the present invention having 0.010" thick conductors (28 and 30) with a width (or height) of 0.080 and a length of 4" and (2) a 0.020" wide 1 oz. copper trace 4" in length:

| Surface Mounted Bus | 0.020 Trace |
|---|---|
| L = 4.8 nanohenries | L = 89.4 nanohenries |
| C = 79 picofarads | C = Very low 1 picofarads |
| R = .34 milliohms | R = 96 milliohms |
| Z = 61 Ohms | Z = Very high 90 Kilo Ohms |
| Current Carrying = 2.5 Amps | Current Carrying = 89 milliamps |

As can be seen of the surface mounted buss, the inductance is considerably higher with the 0.020 trace. This higher inductance results in more circuitry noise. The lower inductance of this invention will tend to reduce circuit noise up to 50%. The higher capacitance helps to reduce noise as well as provide a better transmission line and reduce up to 50% of the required decoupling capacitors. The low resistivity helps assure the proper voltages reaching the load. Characteristic Impedance (Z) is a representation of the quality of the transmission line. As the FIGURES show, the characteristic impedance of the surface mounted buss of this invention is two orders of magnitude better (lower Z is better) than the trace.

Since the surface mounted buss bars of the present invention have lower inductance than the circuit traces used for bussing, the surface mounted buss bars can deliver small voltage changes very quickly, thus meeting the needs of a new generation of logic and memory components which use small voltage tolerances ($\frac{1}{4}$ to $\frac{1}{2}$ volt.) for switching.

A particularly interesting advantage of the configuration of FIGS. 1, 2 and 3 is that the buss bar mounted at the surface of the circuit board and vertical or perpendicular to the board provides RF shielding between groups of circuit components on opposite sides of the board. Also, a surface mounted buss bar of this configuration can fit into about 70 mils of space (about 30 mils for the buss bar and 20 mils for solder pads on each side of the buss bar; whereas two upper traces and space between them require from 90–250 mils. This illustrates the significant real estate saving which can be realized along with the other advantages of this invention.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A buss bar for surface mounting on a circuit board comprising:

at least one electrically conductive layer;

said conductive layer including mounting means adapted to be mounted on at least one connection pad located at the surface of a circuit board to effect electrical and mechanical connection therewith, said mounting means being self-supportive on said circuit board wherein said mounted conductive layer is adapted to be spaced from said surface of said circuit board;

said mounting means including;

electrically conductive stud means, said stud means being adapted to be electrically and mechanically connected to said connection pads, and said stud means including means to electrically and mechanically mount said conductive layer thereon;

said stud means further including:

a base portion, said base portion being electrically and mechanically mountable on said connection pads of said circuit boad; and a substantially vertical stem portion extending from said base portion;

and wherein said conductive layer includes at least one mounting hole therethrough and wherein said stud means mounting means includes;

a substantially horizontal cross member disposed on said stem portion; and latch means disposed on said stem portion and spaced from said cross member;

said stem portion communicating through said mounting holes wherein said latch means effects a snap fit with said conductive layer.

2. The buss bar of claim 1 wherein said latch means is flexible.

3. A buss bar for surface mounting on a circuit board comprising:

a first electrically conductive layer;

a second electrically conductive layer;

an insulating spacer separating said first and second electrically conductive layers; and said conductive layers including mounting means adapted to be mounted on connection pads located at the surface of a circuit board to effect electircal and mechanical connection therewith, said mounting means being self-supportive on said circuit board wherein said mounted conductive layers are adapted to be spaced from said surface of said circuit board;

said mounting means including:

electrically conductive stud means, said stud means being adapted to be electrically and mechanically connected to said connection pads; and said stud means including means to electrically and mechanically mount said conductive layers thereon;

said stud means further including:

a base portion, said base portion being electrically and mechanically mountable on said connection pads of said circuit boards; and a substantially vertical stem portion extending from said base portion;

and wherein said conductive layers include at least one mounting hole therethrough and wherein said stud means mounting means includes;

a substantially horizontal cross member disposed on said stem portion; and latch means disposed on said stem portion and spaced from said cross member;

said stem portion communicating through said mounting holes wherein said latch means effects a snap fit with one of said conductive layers or with said insulating spacer.

4. The buss bar of claim 3 wherein:

one of said first or second conductive layers is electrically connected to said stud means inside said mounting hole; and the other of said first or second conductive layers is spaced from said stud means within said mounting hole.

5. The buss bar of claim 3 wherein said latch means is flexible.

6. An apparatus for mounting electrical components on a circuit board comprising:

electrically conductive stud means, said stud means including mounting means adapted to be mounted on connection pads located at the surface of a circuit board to effect electrical and mechanical connection therewith;

said stud means including means to electrically and mechanically mount an electrical component thereon;

said stud means including;

a base portion, said base portion being electrically and mechanically mountable on said connection pads of said circuit board; and a substantially vertical stem portion extending from said base portion;

and wherein said electrical component includes at least one mounting hole therethrough and wherein said stud means mounting means includes;

a substantially horizontal cross member disposed on said stem portion; and latch means disposed on said stem portion and spaced from said cross member;

said stem portion communicating through said mounting holes wherein said latch means effects a snap fit with said electrical component.

7. The apparatus of claim 6 wherein said latch means is flexible.

8. A buss bar for surface mounting on a circuit board comprising:

a first electrically conductive layer;

a second electrically conductive layer;

an insulating spacer separating said first and second electrically conductive layers; and an outer insulating sheath encapsulating said conductive layers and insulating spacer;

said conductive layers including mounting means adapted to be mounted on connection pads located at the surface of a circuit board to effect electrical and mechanical connection therewith, said mounting means being self-supportive on said circuit board wherein said mounted conductive layers are adapted to be spaced from said surface of said circuit board;

said mounting means including;

electrically conductive stud means, said stud means being adapted to be electrically and mechanically connected to said connection pad; and said stud means including means to electrically and mechanically mount said conductive layers thereon;

said stud means further including;

a base portion, said base portion being electrically and mechanically mountable on said connection loads of said circuit board; and a substantially vertical stem portion extending from said base portion;

and wherein said conductive layers include at least one mounting hole therethrough and wherein said stud means mounting means includes;

a substantially horizontal cross member disposed on said stem portion; and latch means disposed on said stem portion and spaced from said cross member;

said stem portion communicating through said mounting holes wherein said latch means effects a snap fit with one of said conductive layers or with said insulating spacer.

9. The buss bar of claim 8 wherein:

one of said first or second conductive layers is electrically connected to said stud means inside said mounting hole; and the other of said first or second conductive layers is spaced from said stud means within said mounting hole.

10. The buss bar of claim 8 wherein said latch means is flexible.

* * * * *